US009059164B2

(12) United States Patent
Cheng et al.

(10) Patent No.: US 9,059,164 B2
(45) Date of Patent: Jun. 16, 2015

(54) EMBEDDED INTERLEVEL DIELECTRIC BARRIER LAYERS FOR REPLACEMENT METAL GATE FIELD EFFECT TRANSISTORS

(71) Applicant: International Business Machines Corporation, Armonk, NY (US)

(72) Inventors: Kangguo Cheng, Schenectady, NY (US); Ali Khakifirooz, Mountain View, CA (US); Alexander Reznicek, Troy, NY (US); Charan V. Surisetty, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/059,480

(22) Filed: Oct. 22, 2013

(65) Prior Publication Data
US 2015/0108589 A1    Apr. 23, 2015

(51) Int. Cl.
| | |
|---|---|
| *H01L 21/8238* | (2006.01) |
| *H01L 29/49* | (2006.01) |
| *H01L 29/51* | (2006.01) |
| *H01L 21/28* | (2006.01) |
| *H01L 21/283* | (2006.01) |
| *H01L 29/423* | (2006.01) |

(52) U.S. Cl.
CPC ........ *H01L 29/511* (2013.01); *H01L 21/28008* (2013.01); *H01L 21/283* (2013.01); *H01L 29/42364* (2013.01)

(58) Field of Classification Search
CPC .......... H01L 21/823842; H01L 29/6659; H01L 29/66545; H01L 21/28114; H01L 29/42376; H01L 29/66606; H01L 29/49; H01L 29/4966
See application file for complete search history.

(56) References Cited

U.S. PATENT DOCUMENTS

| | | | |
|---|---|---|---|
| 8,084,311 B1 * | 12/2011 | Horak et al. ................ | 438/183 |
| 8,334,184 B2 | 12/2012 | Steigerwald et al. | |
| 8,390,072 B2 | 3/2013 | Chuang et al. | |
| 8,436,404 B2 | 5/2013 | Bohr et al. | |
| 8,466,027 B2 | 6/2013 | Chen et al. | |
| 2009/0039433 A1 * | 2/2009 | Yang et al. ................ | 257/365 |
| 2010/0087056 A1 * | 4/2010 | Chung et al. .............. | 438/585 |
| 2011/0193161 A1 * | 8/2011 | Zhu et al. ................... | 257/343 |
| 2012/0025329 A1 * | 2/2012 | Wu et al. .................... | 257/411 |
| 2012/0052666 A1 * | 3/2012 | Choi ........................... | 438/585 |
| 2012/0175711 A1 * | 7/2012 | Ramachandran et al. .... | 257/383 |
| 2012/0211844 A1 * | 8/2012 | Schloesser et al. .......... | 257/410 |

(Continued)

*Primary Examiner* — Jarrett Stark
*Assistant Examiner* — Bitew Dinke
(74) *Attorney, Agent, or Firm* — Steven M. Kellner; Yuanmin Cai

(57) ABSTRACT

A semiconductor structure may be formed by forming a sacrificial gate above a substrate covered by a hard mask, depositing a first interlevel dielectric (ILD) layer above the sacrificial gate, recessing the first ILD layer to a thickness less than the height of the sacrificial gate, depositing an etch barrier layer above the first ILD layer, depositing a second ILD layer above the etch barrier layer, planarizing the second ILD layer and the etch barrier layer to expose the hard mask using the hard mask as a planarization stop, removing the hard mask and sacrificial gate to form a gate cavity, forming a replacement metal gate in the gate cavity, removing the second ILD layer, and planarizing the replacement metal gate using the etch barrier layer as a planarization stop. A supplementary electrode layer may be formed above the replacement metal gate prior to planarizing the replacement metal gate.

19 Claims, 11 Drawing Sheets

(56) References Cited

U.S. PATENT DOCUMENTS

| | | | |
|---|---|---|---|
| 2013/0043592 A1* | 2/2013 | Park et al. | 257/754 |
| 2013/0095644 A1 | 4/2013 | Tu et al. | |
| 2013/0102125 A1 | 4/2013 | Venigalla et al. | |
| 2013/0105903 A1* | 5/2013 | Chang et al. | 257/369 |
| 2013/0157452 A1 | 6/2013 | Chen et al. | |
| 2013/0181292 A1* | 7/2013 | Sardesai | 257/368 |
| 2013/0260548 A1* | 10/2013 | Park | 438/592 |
| 2013/0299920 A1* | 11/2013 | Yin et al. | 257/408 |
| 2013/0320412 A1* | 12/2013 | Yamasaki | 257/288 |
| 2014/0252431 A1* | 9/2014 | Lee et al. | 257/288 |

* cited by examiner

US 9,059,164 B2

EMBEDDED INTERLEVEL DIELECTRIC BARRIER LAYERS FOR REPLACEMENT METAL GATE FIELD EFFECT TRANSISTORS

BACKGROUND

The present invention relates to fabricating semiconductor devices, and particularly to incorporating an embedded barrier layer in the interlevel dielectric layer of a replacement metal gate field effect transistor.

Field effect transistors (FETs) are commonly employed in electronic circuit applications. FETs may include a source region and a drain region spaced apart by a semiconductor channel region. In planar FETs, the semiconductor channel region may be a semiconductor substrate. In fin FETs, the semiconductor channel region may be a semiconductor fin. A gate, potentially including a gate dielectric layer, a work function metal layer, and a metal electrode, may be formed above the channel region. By applying voltage to the gate, the conductivity of the channel region may increase and allow current to flow from the source region to the drain region.

Due in part to the relative instability of the dielectric layer and work function metal layer of the gate, a gate-last process, or replacement metal gate process, may be used where a sacrificial gate is formed prior to forming other components of the FET. The sacrificial gate may then be removed to form a recessed region that may then be filled with a replacement metal gate potentially including a gate dielectric layer, a work function metal layer, and a metal electrode. Because the replacement metal gate is formed after the other components of the FET, it is not subjected to various potentially damaging processing steps, for example high-temperature anneals.

After forming the FET, an interlevel dielectric (ILD) layer may be deposited above the FET to insulate the FET from surrounding structures. The ILD layer may be etched to form contact cavities, which may then be filled with metal to form contacts electrically connected to the source region, the drain region, and the gate.

SUMMARY

An embodiment of the invention may include a method of forming a semiconductor structure by forming a sacrificial gate above a substrate covered by a hard mask, depositing a first interlevel dielectric (ILD) layer above the sacrificial gate, recessing the first ILD layer to a thickness less than the height of the sacrificial gate, depositing an etch barrier layer above the first ILD layer, depositing a second ILD layer above the etch barrier layer, planarizing the second ILD layer and the etch barrier layer to expose the hard mask using the hard mask as a planarization stop, removing the hard mask and sacrificial gate to form a gate cavity, forming a replacement metal gate in the gate cavity, removing the second ILD layer, and planarizing the replacement metal gate using the etch barrier layer as a planarization stop. A supplementary electrode layer may be formed above the replacement metal gate prior to planarizing the replacement metal gate. The method may further include replacing a top portion of the gate electrode with a gate cap and depositing a third ILD layer above the gate cap and the etch barrier layer. The third ILD layer, the etch barrier layer, and the first ILD layer may be etched to form a contact cavity self-aligned to the gate cap exposing at least a portion of a source/drain region adjacent to the replacement metal gate and a metal contact may be formed in the contact cavity. The third ILD layer and the gate cap may also be etched to form a contact cavity self-aligned to the etch barrier layer exposing at least a portion of the replacement metal gate and a metal contact may be formed in the contact cavity.

In another embodiment of the invention, a method of replacing a sacrificial gate with a replacement metal gate may include forming an interlevel dielectric (ILD) stack above the sacrificial gate having a thickness approximately equal to the height of the sacrificial gate. The ILD stack may include a first ILD layer having a thickness less than the height of the sacrificial gate, an etch barrier layer above the first ILD layer, and a second ILD layer above the etch barrier layer. The method may further include removing the sacrificial gate to form a gate cavity, forming a gate electrode in the gate cavity, removing the second ILD layer, and planarizing the gate electrode using the etch barrier layer as a planarization stop.

In another embodiment of the invention, a semiconductor structure may include a substrate, a gate above the substrate, a first dielectric layer above the substrate, and an etch barrier layer above the first dielectric layer having a top surface approximately coplanar with a top surface of the gate. The structure may further include a second dielectric layer above the etch barrier layer. The structure may further include a metal contact electrically connected to a source/drain region adjacent to the gate in direct contact with the gate cap. The metal contact may be in direct contact with the gate cap and formed in the first dielectric layer, the etch barrier layer, and the second dielectric layer. The structure may further include a metal contact electrically connected to the gate formed in the second ILD in the second ILD layer and the gate cap.

Figure 1:
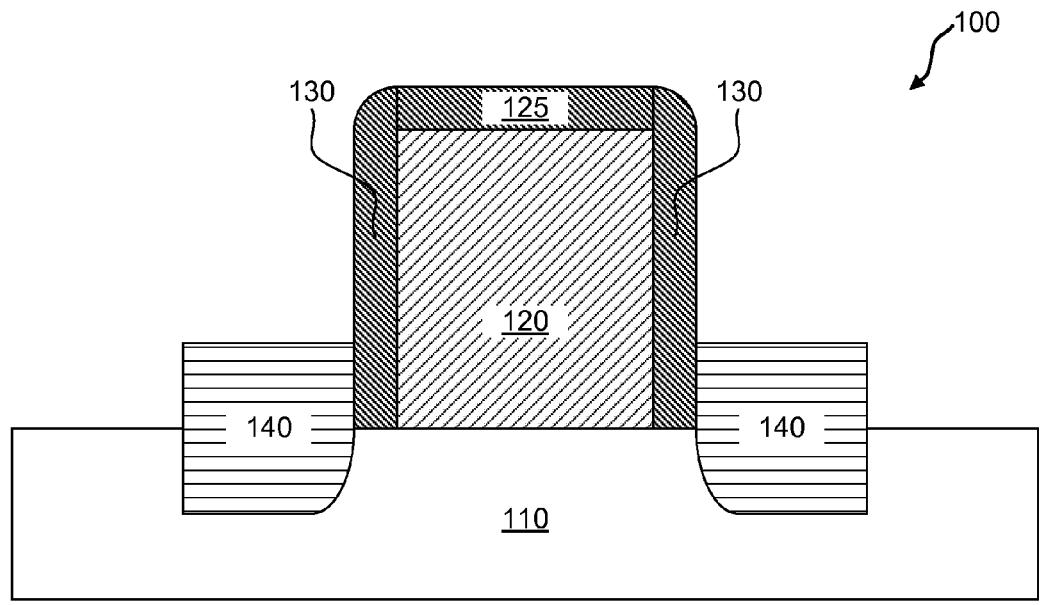
FIG. 1 is a side view depicting a field effect transistor (FET) structure, according to an embodiment of the present invention.

Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

Embodiments of the present invention may include methods of incorporating an embedded etch barrier layer into the interlevel dielectric (ILD) layer of field effect transistors (FETs) having replacement metal gates, as well as the structure formed thereby. Because the typical process of fabricating FETs having replacement metal gates involves multiple etching and planarizing steps, the gate height of FET may vary due to the cumulative variation of each etching and planarizing step, which may ultimately lead to reduced device performance, increased device variability, or inoperability. By incorporating an embedded etch barrier layer into the ILD layer, embodiments of the present invention may, among other potential benefits, reduce gate height variation by planarizing the replacement metal gates to a consistent level (i.e., the level of the embedded etch barrier).

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Referring to FIG. 1 a field effect transistor (FET) structure 100 may be provided or fabricated. The FET structure 100 may include a sacrificial gate 120 above a substrate 110. A pair of source/drain regions 140 may be adjacent to substrate 110 on opposite sides of the sacrificial gate 120, separated from the sacrificial gate 120 by spacers 130. A hard mask 125 may cover a top surface of the sacrificial gate 120.

In the depicted embodiment, FET structure 100 is a planar device so that the substrate 110 may be a bulk semiconductor substrate. In such embodiments, the substrate 110 may be made from any of several known semiconductor materials such as, for example, silicon, germanium, silicon-germanium alloy, carbon-doped silicon, carbon-doped silicon-germanium alloy, and compound (e.g. III-V and II-VI) semiconductor materials. Non-limiting examples of compound semiconductor materials include gallium arsenide, indium arsenide, and indium phosphide. Typically the substrate 110 may be approximately, but is not limited to, several hundred microns thick. For example, the substrate 110 may have a thickness ranging from approximately 0.5 mm to approximately 1.5 mm. In other embodiments where the FET structure is a planar device, the substrate 110 may be a semiconductor-on-insulator (SOI) substrate, where a buried insulator layer separates a base substrate from a top semiconductor layer. The components of the FET structure 100 may then be formed in or adjacent to the top semiconductor layer.

In other embodiments, the FET structure 100 may be a fin field effect transistor (finFET), in which case the substrate 110 may be a semiconductor fin. While embodiments depicted in FIGS. 1-17 refer to a planar device, a person of ordinary skill in the art will understand that the method described will apply equally to finFET devices.

The sacrificial gate 120 may have a height ranging from approximately 30 nm to approximately 200 nm, preferably approximately 50 nm to approximately 100 nm. Because the replacement metal gate that will later replace the sacrificial gate 120 may be planarized to height less than its initial height (FIG. 11), the sacrificial gate 120 may have a height greater than the ultimately desired height of the replacement metal gate. The sacrificial gate 120 may include a sacrificial dielectric layer and a sacrificial gate electrode (not shown). The sacrificial dielectric layer may be made of any known dielectric material such as silicon oxide or silicon nitride. The sacrificial gate electrode may be made of, for example, an amorphous or polycrystalline silicon material. Other suitable materials for the sacrificial dielectric layer and the sacrificial gate electrode known in the art may also be used. The sacrificial dielectric layer and the sacrificial gate electrode may be formed by any suitable deposition technique known in the art, including atomic layer deposition (ALD), chemical vapor deposition (CVD), physical vapor deposition (PVD), molecular beam deposition (MBD), pulsed laser deposition (PLD), or liquid source misted chemical deposition (LSMCD).

The hard mask 125 may be formed above the sacrificial gate 120 to protect the sacrificial gate 120 during subsequent fabrication processes. The hard mask 125 may be made of an insulating material, such as, for example, silicon nitride, silicon oxide, silicon oxynitrides, or a combination thereof, may have a thickness ranging from approximately 20 nm to approximately 50 nm, and may be formed by any suitable deposition technique known in the art, including ALD, CVD, PVD, MBD, PLD, or LSMCD.

Spacers 130 may be formed on the sidewalls of the sacrificial gate 120. The spacers 130 may be made of any insulating material, such as silicon nitride, silicon oxide, silicon oxynitrides, or a combination thereof, and may have a thickness ranging from 2 nm to approximately 100 nm, preferably approximately 2 nm to approximately 25 nm. The spacers 130 may be made of the same material as the hard mask 125. In a preferred embodiment, the hard mask 125 and the spacers 130 may be made of silicon nitride. The spacers 130 may be formed by any method known in the art, including depositing a conformal silicon nitride layer over the sacrificial gate 120 and removing unwanted material from the conformal silicon nitride layer using a anisotropic etching process such as, for example, reactive ion etching (RIE) or plasma etching (not shown). Methods of forming spacers are well-known in the art and other methods are explicitly contemplated. Further, in various embodiments, the spacers 130 may include one or more layers. While the spacers 130 are herein described in the plural, the spacers 130 may consist of a single spacer surrounding the sacrificial gate 120.

The source/drain regions 140 may be formed on the substrate 110 adjacent to the spacers 130 on opposite sides of the sacrificial gate 120. Numerous methods of forming source/drain regions are known in the art, any of which may be used to form the source/drain regions 140. In some embodiments, the source/drain regions 140 may be formed by doping portions of the substrate 110 (not shown). In other embodiments, including the embodiment depicted in FIG. 1, the source/drain regions 140 may be formed by growing epitaxial semiconductor regions adjacent to the substrate 110. The epitaxial semiconductor regions may extend above and/or below the top surface of the substrate 110 as shown.

Figure 2:
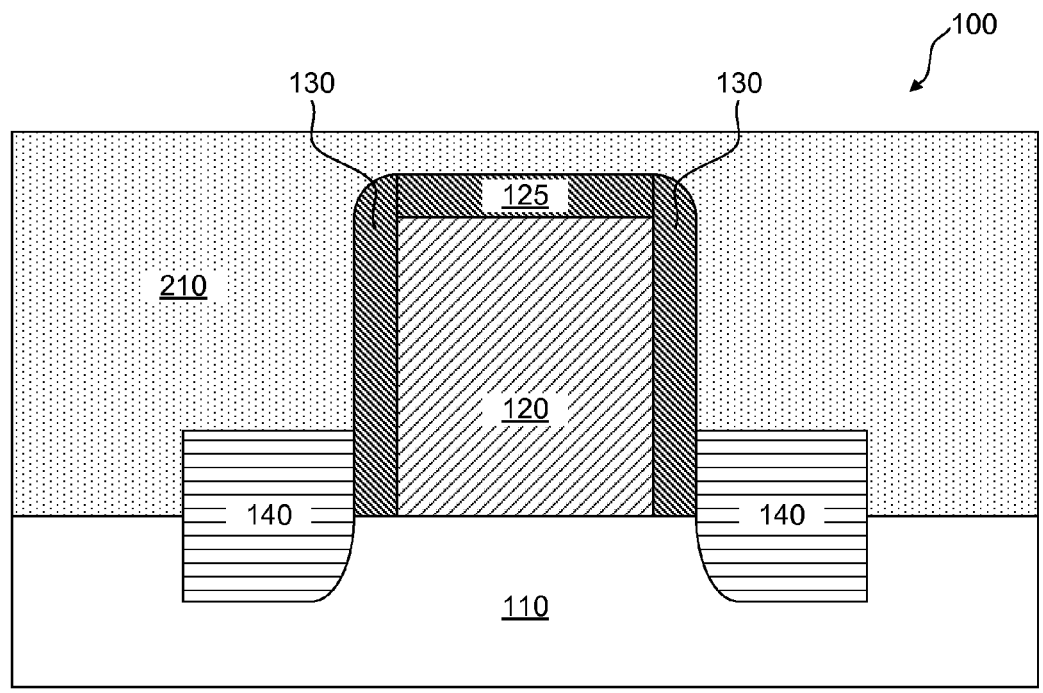
FIG. 2 is a side view depicting depositing a first interlevel dielectric (ILD) layer above the FET structure, according to an embodiment of the present invention.

Referring to FIG. 2, a first ILD layer 210 may deposited above the FET structure 100. The first ILD layer 210 may include any suitable dielectric material, for example, silicon oxide, silicon nitride, hydrogenated silicon carbon oxide, silicon based low-k dielectrics, flowable oxides, porous dielectrics, or organic dielectrics including porous organic dielectrics and may be formed using any suitable deposition techniques including ALD, CVD, plasma enhanced CVD, spin on deposition, or PVD. In some embodiments, various barriers or liners (not shown) may be formed below the first ILD layer 210.

Figure 3:
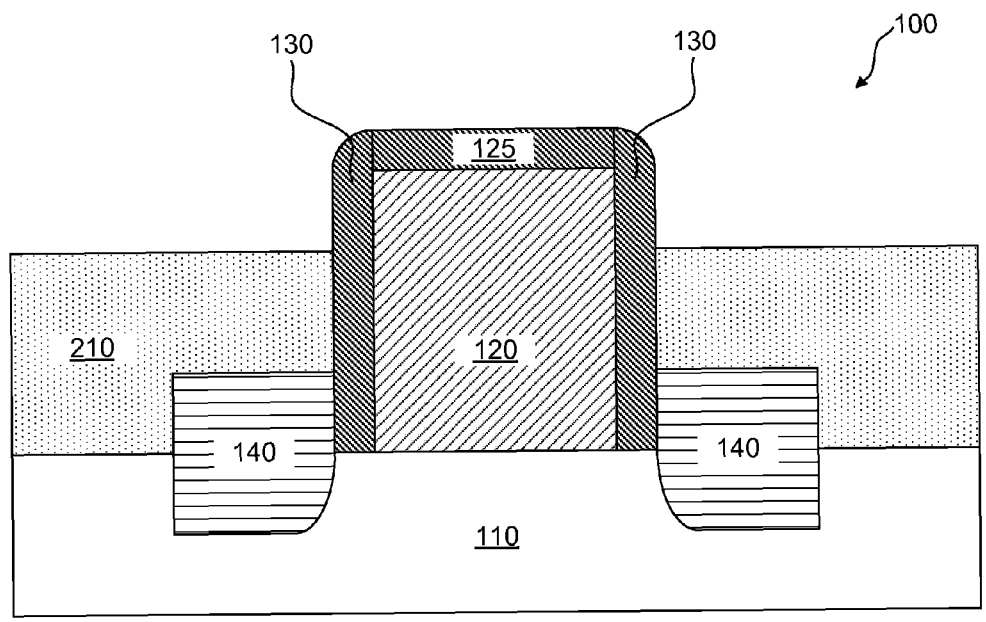
FIG. 3 is a side view depicting recessing the first ILD layer to a thickness less than the height of the sacrificial gate of the FET structure, according to an embodiment of the present invention.

Referring to FIG. 3, the first ILD layer 210 may be recessed to a thickness less than the height of the sacrificial gate 120. The first ILD layer 210 may be recessed to a thickness ranging from approximately 20% to approximately 70% of the height of the sacrificial gate 120. In an exemplary embodiment, the ILD layer 210 may have a thickness, after recessing, ranging from approximately 20 nm to approximately 60 nm. The first ILD layer 210 may be recessed using any suitable etching technique in the art, including for example, anisotropic dry etching techniques such as RIE and plasma etching. In some embodiments, suitable wet etching techniques may also be used.

Figure 4:
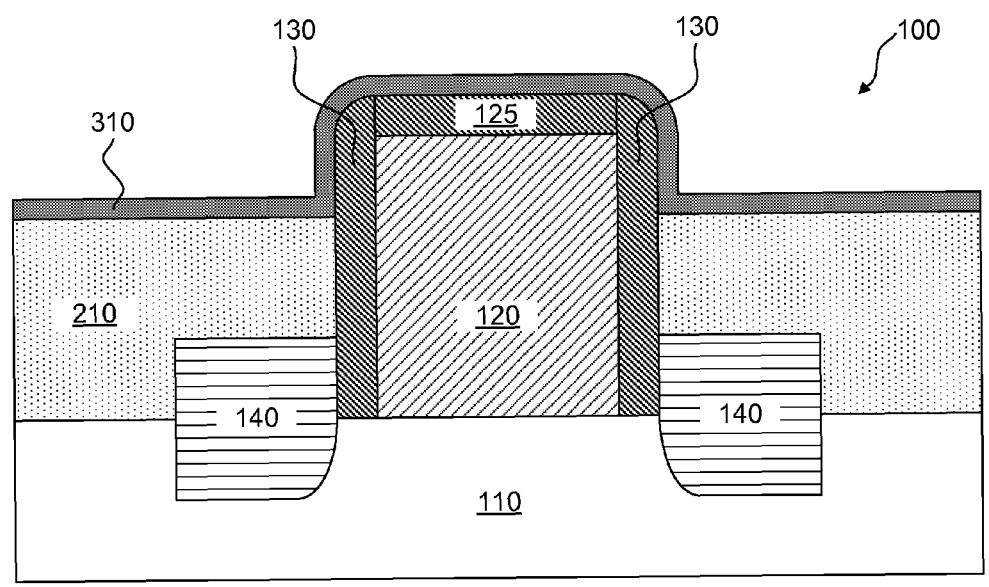
FIG. 4 is a side view depicting depositing an etch barrier layer above the first ILD layer and the FET structure, according to an embodiment of the present invention.
Figure 11:
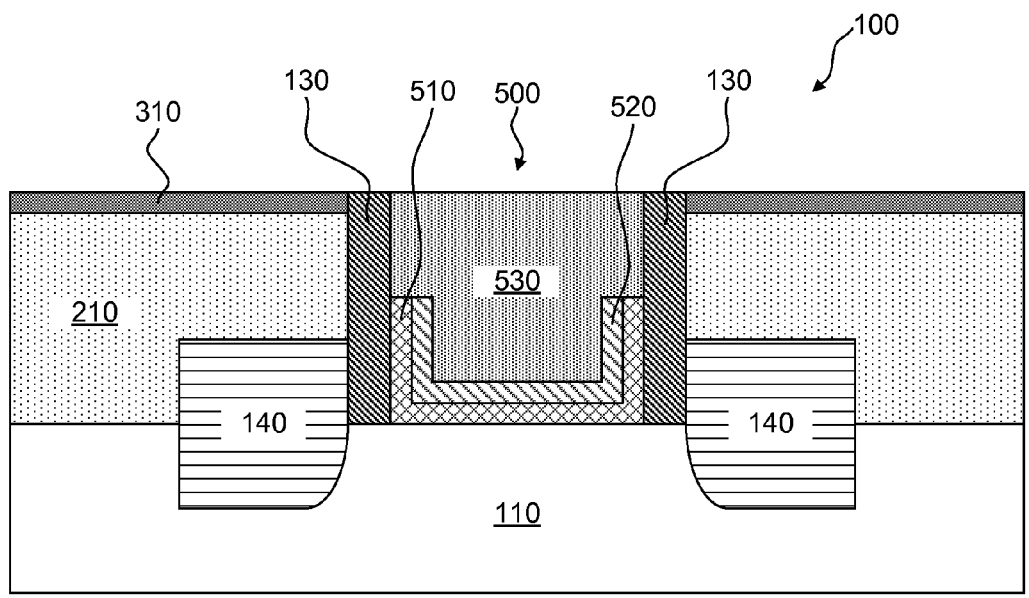
FIG. 11 is a side view depicting planarizing the metal layer and the replacement metal gate, according to an embodiment of the present invention.

Referring to FIG. 4, an etch barrier layer 310 may be deposited above the first ILD layer 210. The etch barrier layer 310 may be made of any material suitable for use as a planarization stop layer for a metal planarization process, such as that described below in conjunction with FIG. 11, where the replacement metal gate is planarized (FIG. 11). In an exemplary embodiment, the etch barrier 310 may be made of a material selected from the group including hafnium oxide ($Hf_xO_y$), hafnium silicate ($Hf_xSi_yO_z$), or aluminum oxide ($Al_xO_y$). The etch barrier layer 310 may be formed using any suitable deposition techniques including ALD, CVD, plasma enhanced CVD, spin on deposition, or PVD.

The etch barrier layer 310 may have a thickness ranging from approximately 2 nm to approximately 10 nm. Because the etch barrier layer may subsequently be used as a planarization stop layer when planarizing the replacement metal gate (FIG. 11), the combined thickness of the etch barrier layer 310 and the first ILD layer 210 may determine the height of the replacement metal gate following the planarization process. Therefore, the thicknesses of the first ILD layer 210 and the etch barrier layer 310 may be selected so that their combined thickness is approximately equal to the desired final height of the replacement metal gate.

Figure 5:
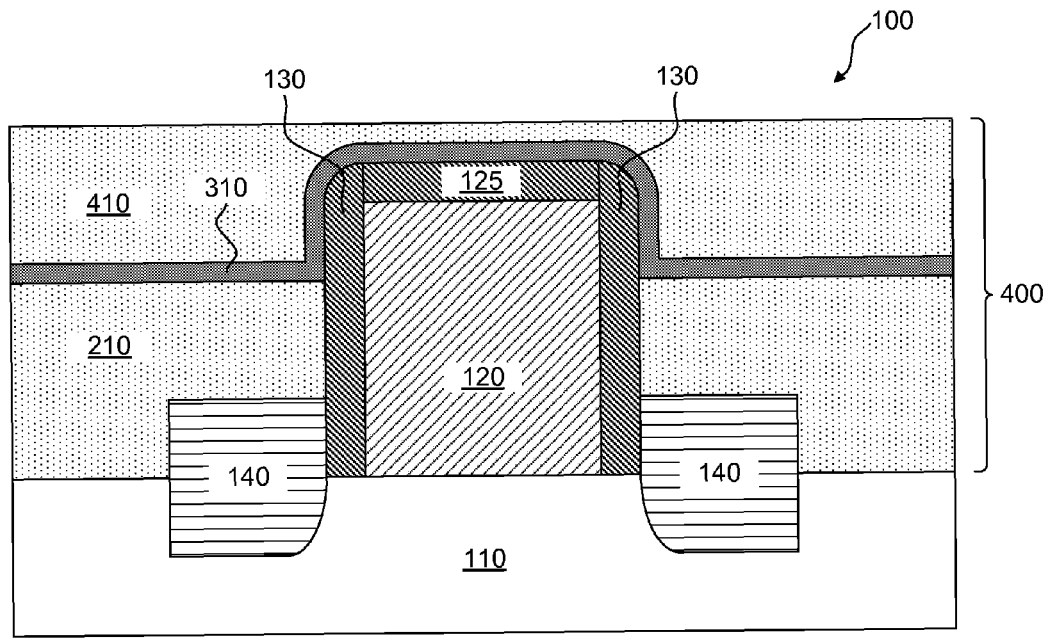
FIG. 5 is a side view depicting depositing a second ILD layer above the barrier layer, according to an embodiment of the present invention.

Referring to FIG. 5, a second ILD layer 410 may be deposited above the etch barrier layer 310. Collectively, the first ILD layer 210, the etch barrier 310, and the second ILD layer 410 may be referred to as the ILD stack 400. The second ILD layer 410 may be made of any suitable ILD material capable of being removed selectively relative to the etch barrier layer 310, such as any of the same materials as the first ILD layer 210, including, for example, silicon oxide, silicon nitride, hydrogenated silicon carbon oxide, silicon based low-k dielectrics, flowable oxides, porous dielectrics, or organic dielectrics including porous organic dielectrics. The second ILD layer 410 may be made of the same material as the first ILD layer 210, but may also be made of a different material. The second ILD layer 410 may have a thickness at least great enough so that the top surface of the second ILD layer 410 is above the highest portion of the etch barrier layer 310. In an exemplary embodiment, the second ILD layer 410 may have a thickness ranging from approximately 50 nm to approximately 200 nm. The second ILD layer 410 may be formed using any suitable deposition techniques including ALD, CVD, plasma enhanced CVD, spin on deposition, or PVD.

Figure 6:
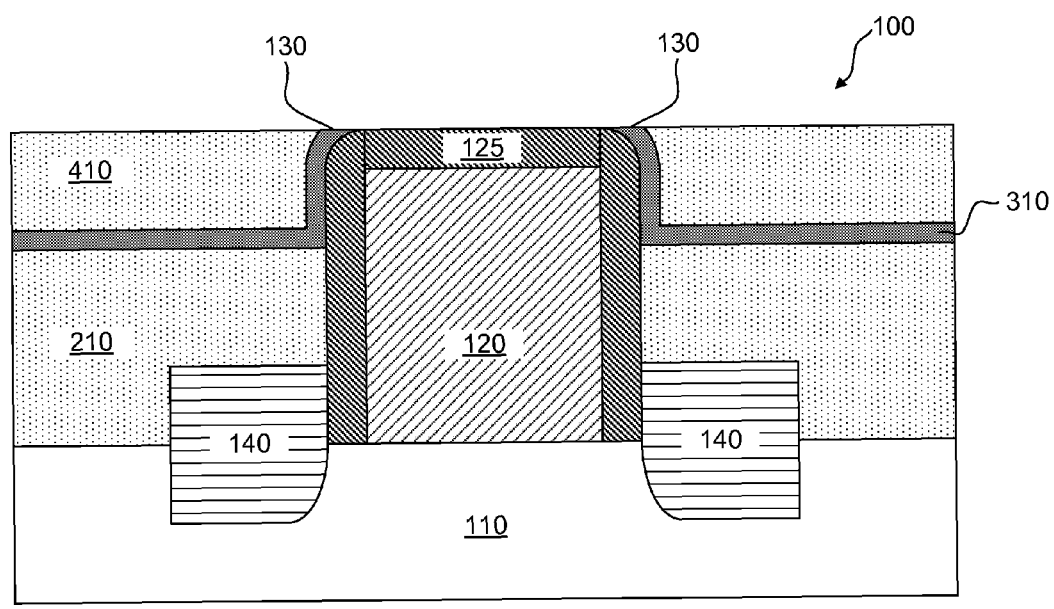
FIG. 6 is a side view depicting planarizing the second ILD layer to expose the FET structure, according to an embodiment of the present invention.

Referring to FIG. 6, the second ILD layer 410 may be planarized using the hard mask 125 as a planarization stop to expose the hard mask 125. During planarization, portions of the etch barrier layer 310 above the hard mask 125 may also be removed. The second ILD layer 410 may be planarized using any suitable planarization method known in the art, including, for example chemical-mechanical planarization (CMP).

Figure 7:
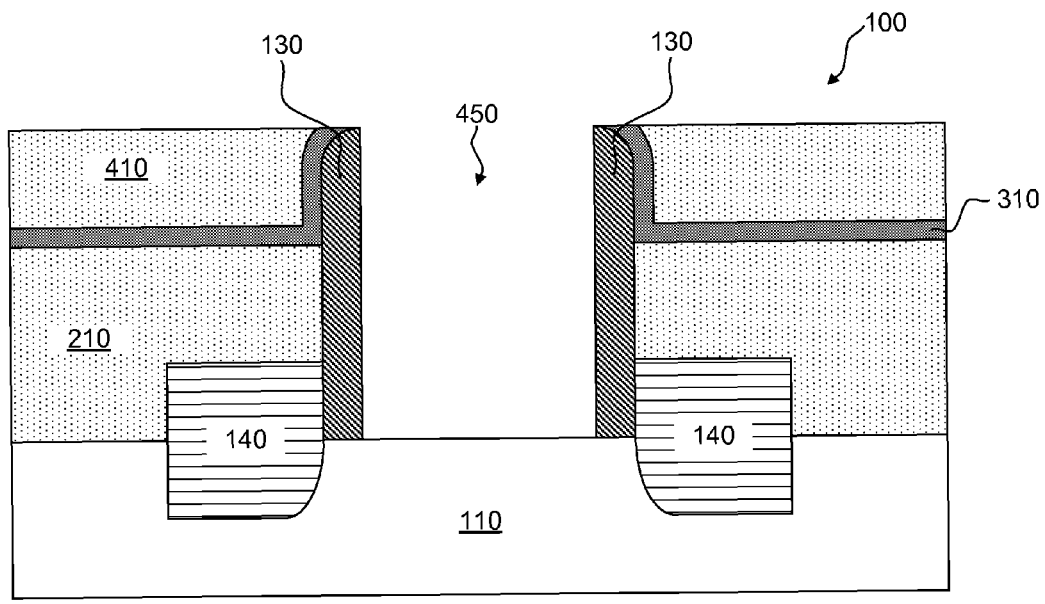
FIG. 7 is a side view depicting removing the hard mask and the sacrificial gate of the FET structure to form a gate cavity, according to an embodiment of the present invention.

Referring to FIG. 7, the hard mask 125 and the sacrificial gate 120 may be removed to form a gate cavity 450. The hard mask 125 and the sacrificial gate 120 may be removed by any suitable etching process known in the art capable of selectively removing the hard mask 125 and the sacrificial gate 120 without substantially removing material from the spacers 130 or the second ILD layer 410. In an exemplary embodiment, the sacrificial gate 120 may be removed, for example, by a reactive ion etching (RIE) process capable of selectively removing silicon to remove the sacrificial gate electrode (not shown) and a hydrofluoric acid-containing wet etch to remove the sacrificial gate dielectric layer (not shown).

Figure 8:
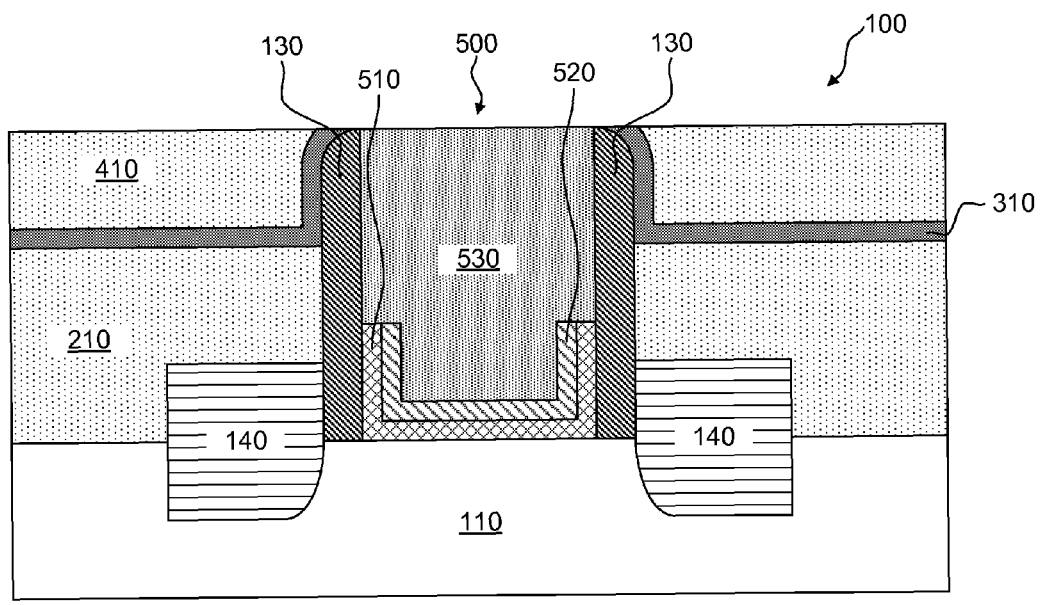
FIG. 8 is a side view depicting filling the gate cavity with a replacement metal gate, according to an embodiment of the present invention.

Referring to FIG. 8, a replacement metal gate 500 may be formed in the gate cavity 450 (FIG. 7) using any suitable method known in the art, including for example typical deposition techniques such as CVD, PVD, and ALD, sputtering, and plating. The replacement metal gate 500 may include any number of liners, including for example a dielectric layer 510 and a work function metal layer 520, and a gate electrode 530 filling the remainder of the gate cavity 450. In some embodiments, including the depicted embodiment, the dielectric layer 510 and the work function metal layer 520 may be recessed to below the full height of the gate cavity 450 prior to forming the gate electrode 530. The dielectric layer 510 may include, for example, silicon oxide, hafnium oxide, zirconium oxide, aluminum oxide, titanium oxide, lanthanum oxide, strontium titanium oxide, lanthanum aluminum oxide, and mixtures thereof. The work function metal layer 520 may include, for example, aluminum, lanthanum oxide, magnesium oxide, strontium titanate, and strontium oxide. The gate electrode 530 may be made of gate conductor materials including, but not limited to, zirconium, tungsten, tantalum, hafnium, titanium, aluminum, ruthenium, metal carbides, metal nitrides, transition metal aluminides, tantalum carbide, titanium carbide, tantalum magnesium carbide, or combinations thereof.

Figure 9:
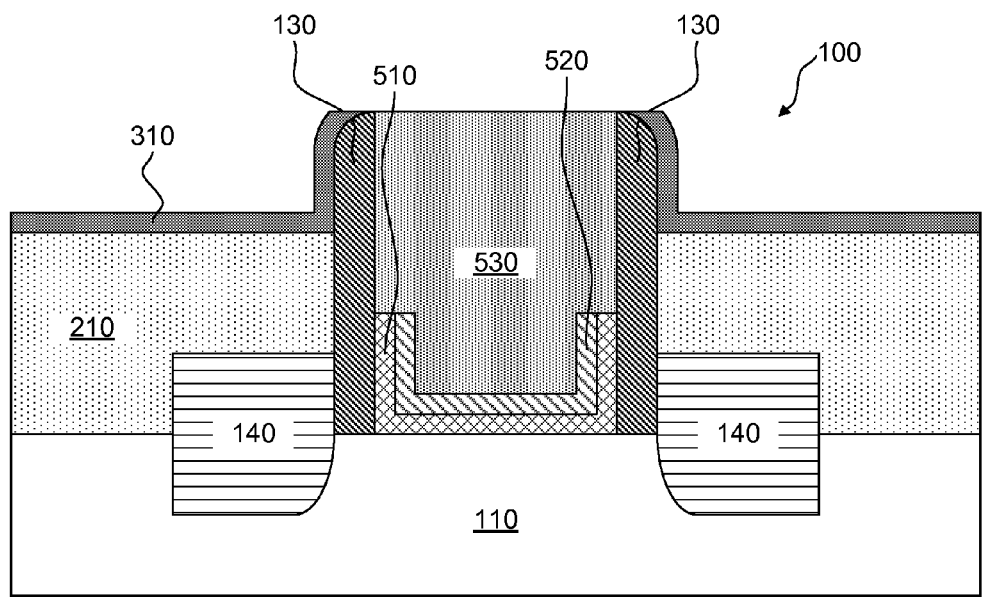
FIG. 9 is a side view depicting removing the second ILD layer, according to an embodiment of the present invention.

Referring to FIG. 9, the second ILD layer 410 may be removed. The second ILD layer 410 may be removed using any suitable etching technique in the art capable of selectively removing the second ILD layer 410 without substantially removing material from the etch barrier layer 310, the spacers 130, and the gate electrode 530, including for example, anisotropic dry etching techniques such as RIE and plasma etching. In some embodiments, suitable wet etching techniques may also be used.

Figure 10:
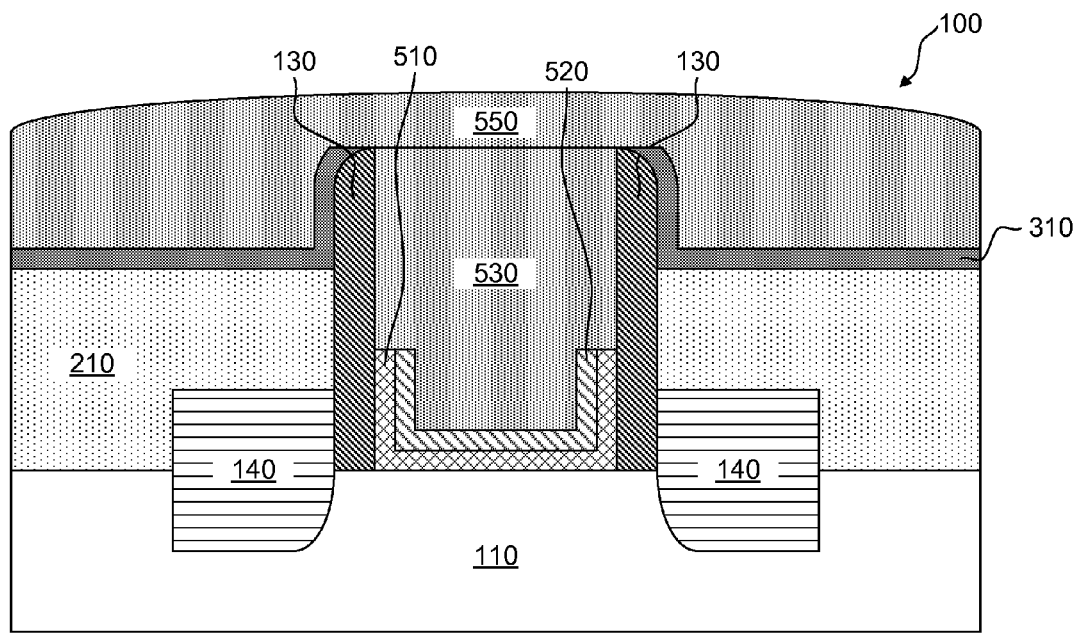
FIG. 10 is a side view depicting depositing a metal layer above the barrier layer, according to an embodiment of the present invention.

Referring to FIG. 10, a supplementary electrode layer 550 may optionally be deposited above the etch barrier layer 310 and the gate electrode 530. The supplementary electrode layer 550 may be deposited in order to ensure that the gate electrode 530 fully fills the gate cavity 450 (FIG. 7), as well as providing a more even top surface prior to the gate electrode planarization process described below in conjunction with FIG. 11. Accordingly, the supplementary electrode layer 550 may be made of the same material as the gate electrode 530, for example zirconium, tungsten, tantalum, hafnium, titanium, aluminum, ruthenium, metal oxides, metal carbides, metal nitrides, transition metal aluminides, tantalum carbide, titanium carbide, tantalum magnesium carbide, or combinations thereof. The supplementary electrode layer 550 may have a thickness above the etch barrier layer 310 and the gate electrode 530 ranging from approximately 10 nm to approximately 50 nm.

Referring to FIG. 11, the gate electrode 530 and the supplementary electrode layer 550, if present, may be planarized using the etch barrier layer 310 as a planarization stop layer. Because of the relatively small cross-sectional area of the approximately vertical portions of the etch barrier layer 310 (i.e., the portions deposited on the spacers 130), they may be removed by the planarization process, and only the approximately horizontal portions of the etch barrier layer 310 (i.e., the portions deposited on the first ILD layer 210) may serve as the planarization stop layer. The gate electrode 530 and the supplementary electrode layer 550 may be planarized using any suitable planarization method known in the art, including, for example chemical-mechanical planarization (CMP), capable of removing the material of the gate electrode 530.

After planarizing the gate electrode 530, the height of the replacement metal gate 500 may be reduced to approximately the combined thickness of the first ILD layer 210 and the etch barrier layer 310. By using the etch barrier layer 310 as the planarization stop layer, the height of the gate electrode may be more uniform relative to that of adjacent gates formed by the same process (not shown) compared to a process where the etch barrier layer 310 is not utilized.

Figure 12:
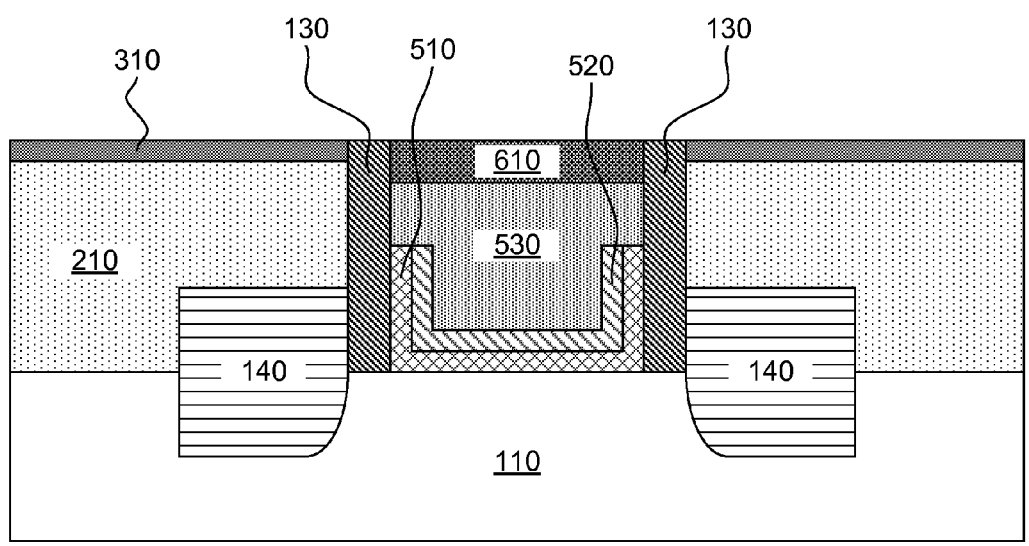
FIG. 12 is a side view depicting recessing the replacement metal gate and forming a gate capping layer, according to an embodiment of the present invention.

Referring to FIG. 12, a portion of the gate electrode 530 may be removed and replaced with a gate cap 610. The portion of the gate electrode 530 may be removed using any suitable wet or dry etching technique known in the art. For example, where the gate electrode 530 is made of tungsten, the gate electrode 530 may be recessed by reactive ion etching in $CF_4$, $CHF_3$, $SF_6$, or other suitable ambients. While recessing the gate electrode 530, the etch barrier layer 310 may further protect the first ILD layer 210. Therefore, the etch barrier layer 310 may further improve the uniformity of the device. The gate cap 610 may then be formed by filling the recess formed by the removal of the portion of the gate electrode with a suitable insulating material, including, for example, silicon nitride, silicon oxide, silicon oxynitrides, or a combination thereof. In an exemplary embodiment, the gate cap 610 may be made of the same material as the spacers 130, preferably silicon nitride.

Figure 13:
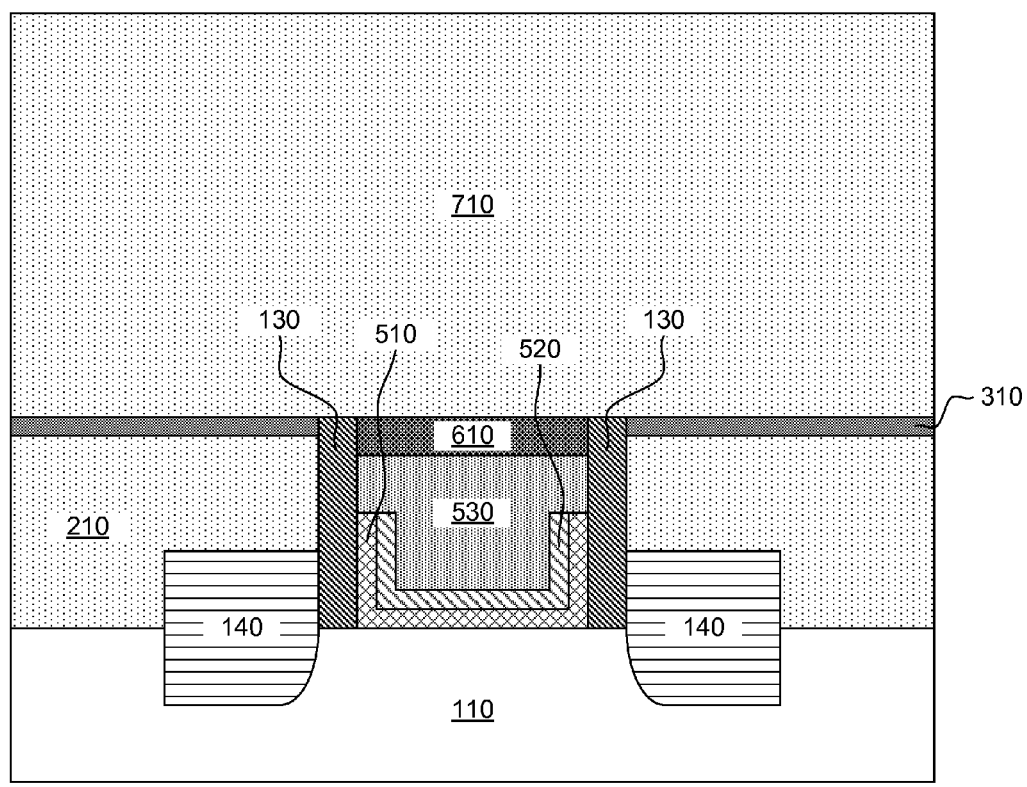
FIG. 13 is a side view depicting depositing a third ILD layer above the barrier layer and the gate capping layer, according to an embodiment of the present invention.

Referring to FIG. 13, a third ILD layer 710 may be deposited above the etch barrier layer 310 and the gate cap 610. The third ILD layer 710 may be made of any of the same materials as the first ILD layer 210, including, for example, silicon oxide, silicon nitride, hydrogenated silicon carbon oxide, silicon based low-k dielectrics, flowable oxides, porous dielectrics, or organic dielectrics including porous organic dielectrics and may be formed using any suitable deposition techniques including ALD, CVD, plasma enhanced CVD, spin on deposition, or PVD. The third ILD layer 710 may include a material capable of being etched selective to the gate cap 610 or the spacers 130.

Figure 14:
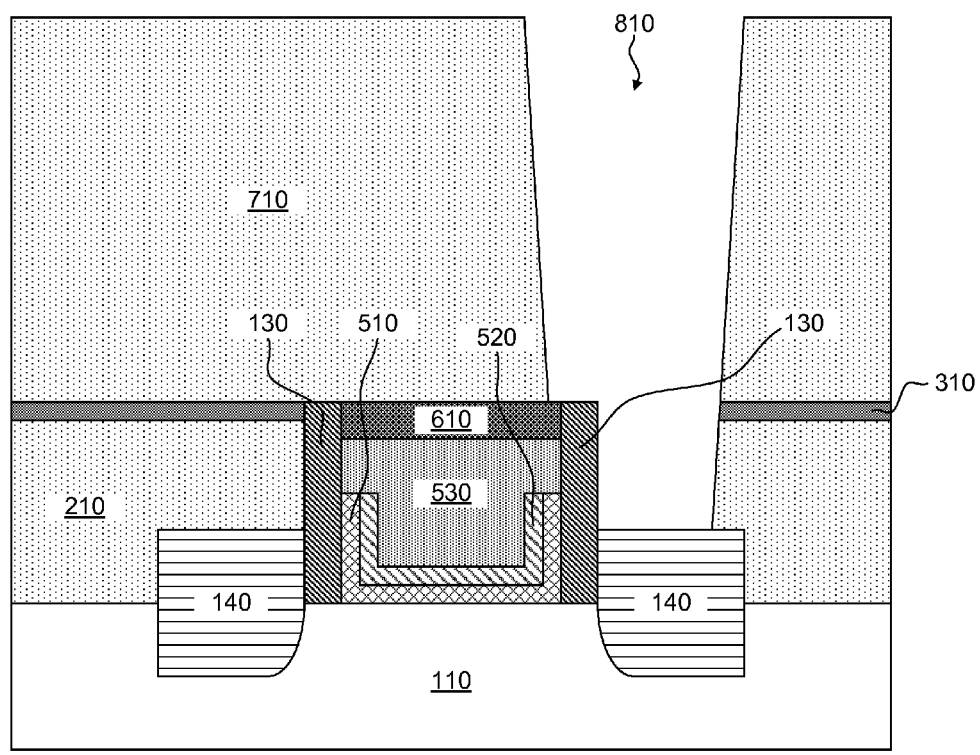
FIG. 14 is a side view depicting forming a contact cavity in the third ILD layer, the barrier layer, and the first ILD layer to expose a portion of the FET structure, according to an embodiment of the present invention.
Figure 15:
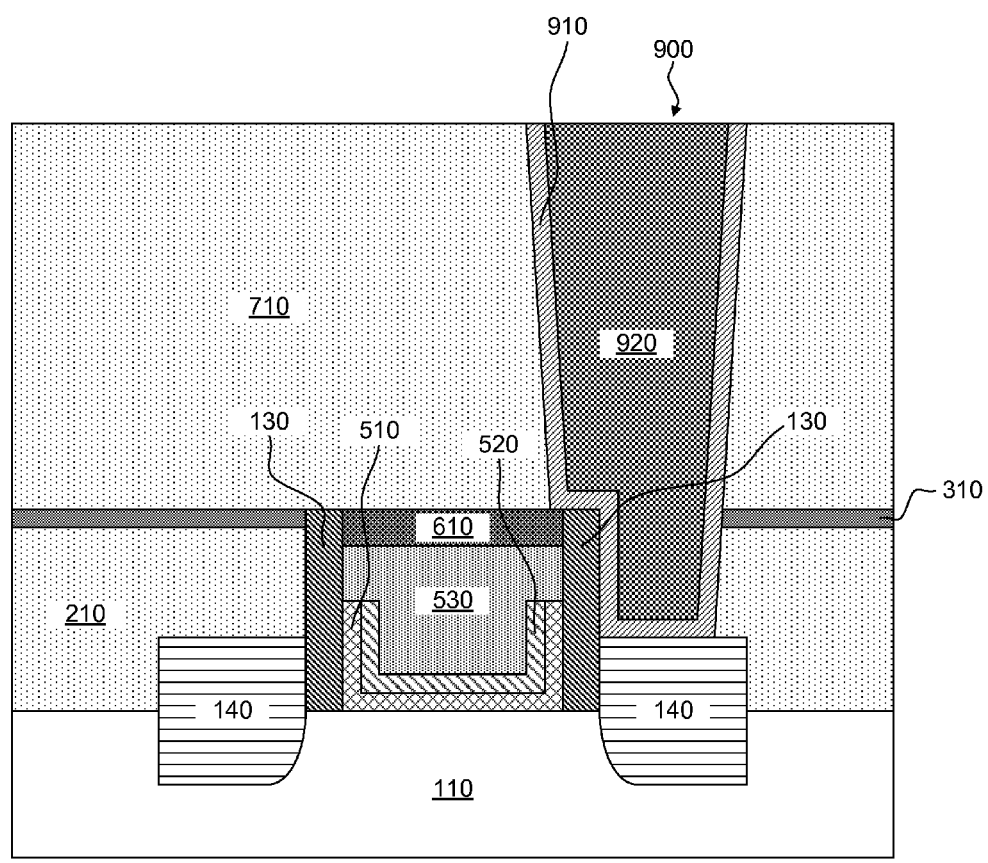
FIG. 15 is a side view depicting forming a metal contact in the contact cavity of FIG. 14, according to an embodiment of the present invention.
Figure 16:
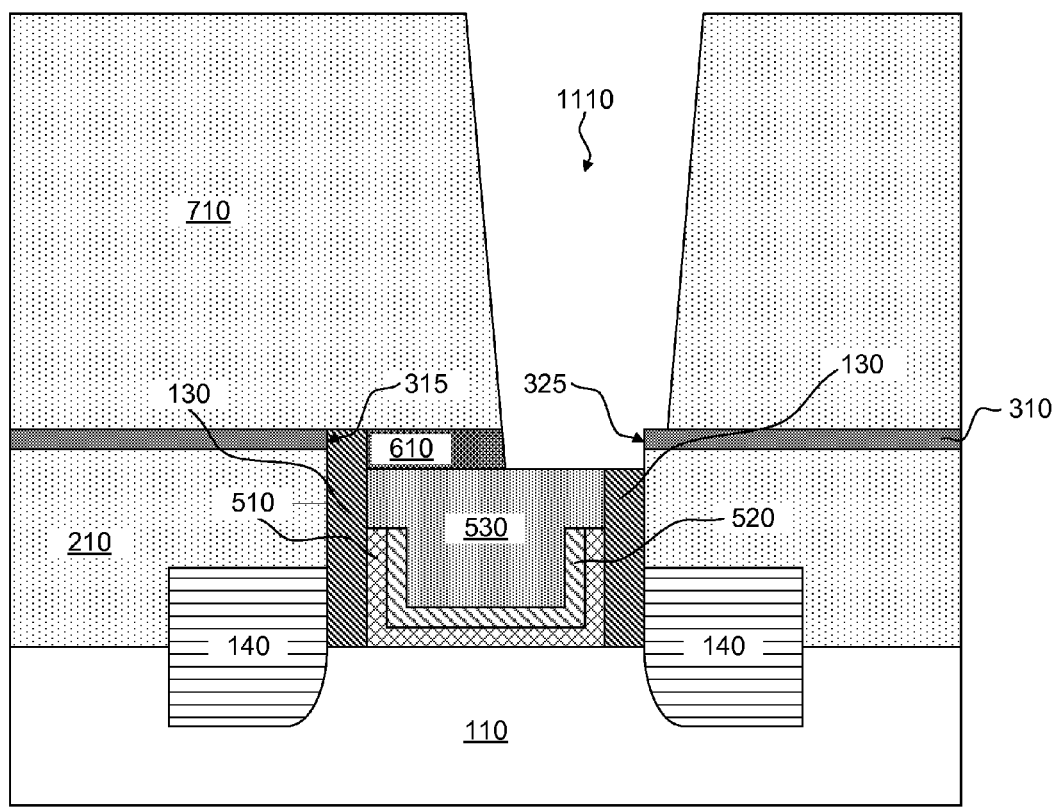
FIG. 16 is a side view depicting forming a contact cavity in the third ILD layer, the gate cap, and the spacers to expose a portion of the replacement metal gate, according to an embodiment of the present invention.
Figure 17:
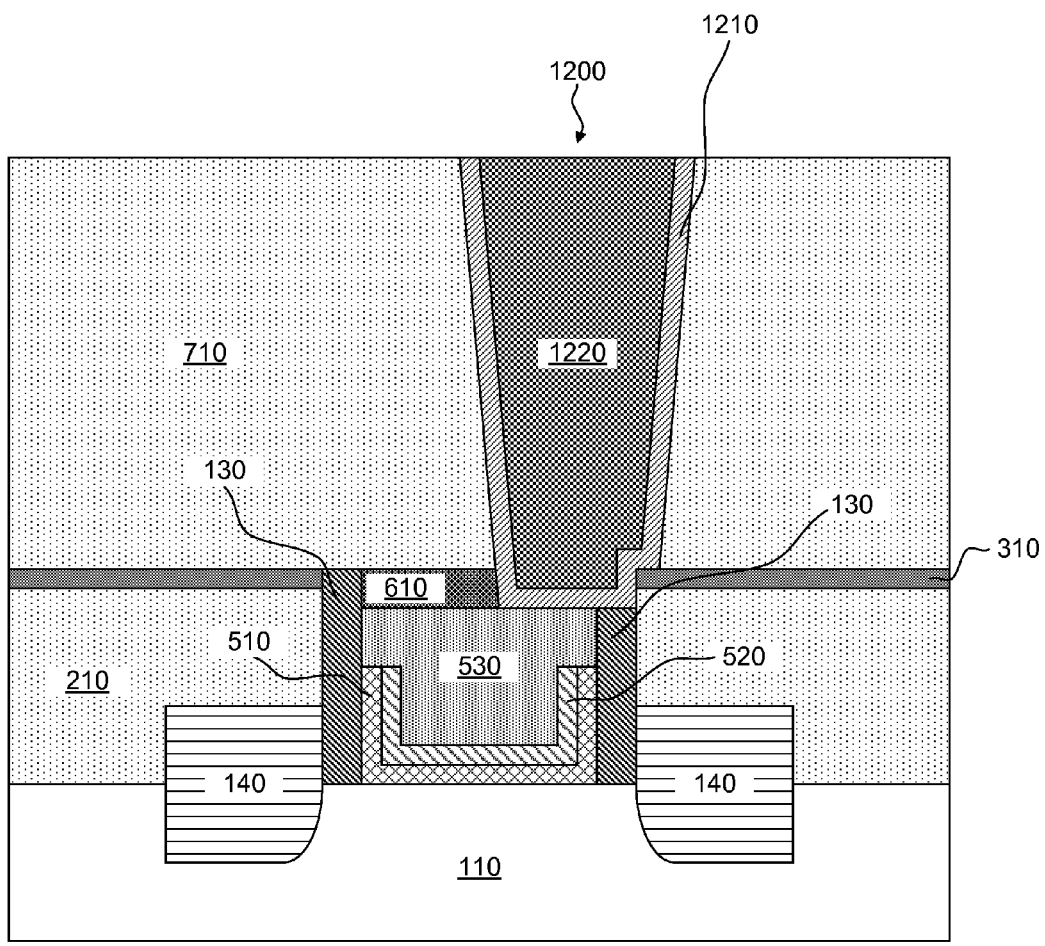
FIG. 17 is a side view depicting forming a metal contact in the contact cavity of FIG. 16, according to an embodiment of the present invention.

After depositing the third ILD layer 710, metal contacts may be formed to provide electrical connections to the source/drain regions 140, as depicted in FIGS. 14-15, and/or to the gate electrode 530, as depicted in FIGS. 16-17. By using the appropriate selective processes, described in more detail below, the metal contacts may be self aligned to the source/drain regions 140 and the gate electrode 530 by using the gate cap 610 and the spacers 130, and the etch barrier layer 310, respectively, as etch barriers.

Referring to FIG. 14, a contact cavity 810 may be etched in the third ILD layer 710, the etch barrier layer 310, and the first ILD layer 210 to expose one of the source/drain regions 140. The third ILD layer 710, the etch barrier layer 310, and the first ILD layer 210 may be etched using a known anisotropic etching process such as RIE or plasma etching capable of selectively etching the third ILD layer 710, the etch barrier layer 310, and the first ILD layer 210 without substantially removing material from the gate cap 610 or the spacers 130. Because the third ILD layer 710, the etch barrier layer 310, and the first ILD layer 210 may not all be etched using the same etch chemistry, all multi-stage etch process utilizing more than one etch chemistry may be used to form the contact cavity 810. By using an etch process selective to the gate cap 610 and the spacers 130, the edge of the contact cavity adjacent to the gate cap 610 and the spacers 130 may be self aligned to the gate cap 610 and the spacers 130. Some amount of etching of the gate cap 610 and the spacers 130 may be acceptable as long as the gate electrode 530 is not exposed.

Referring to FIG. 15, a metal contact 900 may be formed in the contact cavity 810 (FIG. 14) by, for example, filling the contact cavity with a contact liner 910 and a metal fill 920. The metal contact 900 may be formed by any known method in the art, including for example filling the contact cavity 810 (FIG. 14) with a conductive liner 910 and a conductive fill 920. The conductive liner 910 may be made of, for example, titanium, tantalum, nickel, platinum, palladium, erbium, ytterbium, or some combination thereof and formed using known metal deposition techniques including, but not limited to, CVD, PVD and ALD. The conductive fill 920 may include, for example, tungsten, copper, aluminum, silver, gold, alloys thereof, and any suitable combination thereof, and may be deposited by any suitable technique, including but not limited to, for example, ALD, molecular layer deposition (MLD), CVD, in-situ radical assisted deposition, metal-organic chemical vapor deposition (MOCVD), MBE, PVD, sputtering, plating, evaporation, ion beam deposition, electron beam deposition, laser assisted deposition, chemical solution deposition, or any combination thereof.

Referring to FIG. 16, a contact cavity 1110 may be etched in the third ILD layer 710, the gate cap 610, and the spacers 130 to expose at least a portion of the gate electrode 530. The contact cavity 1110 may be formed independently from, or concurrently with, the contact cavity 810 (FIG. 14). The contact cavity 810 and the contact cavity 1110 may be offset, or formed in different planes to prevent overlap.

The third ILD layer 710, the gate cap 610, and the spacers 130 may be etched using a known anisotropic etching process such as RIE or plasma etching capable of selectively etching the third ILD layer 710, the gate cap 610, and the spacers 130 without substantially removing material from the etch barrier layer 310. Because the third ILD layer 710, the gate cap 610, and the spacers 130 may not all be etched using the same etch chemistry, all multi-stage etch process utilizing more than one etch chemistry may be used to form the contact cavity 1110. While FIG. 16 depicts the contact cavity 1110 as offset form the gate electrode 530, the contact cavity may expose any portion of, as well as the entire width of the gate electrode 530. By using etch processes that etch selectively to the etch barrier layer 310, the contact cavity 1110 may be self aligned to any region between the left edge 315 and the right edge 325 of the etch barrier 310. Because the etch barrier layer 310 covers the source/drain regions 140, self-aligning the contact cavity 1110 to the etch barrier layer 310 may prevent shorting between the metal contact subsequently formed in the contact cavity 1110 and the source/drain regions 140.

Referring to FIG. 17, a metal contact 1200 may be formed in the contact cavity 1110 (FIG. 16) by, for example, filling the contact cavity with a contact liner 1210 and a metal fill 1220. The metal contact 1200 may be formed by any known method in the art, including for example filling the contact cavity 1110 with a conductive liner 1210 and a conductive fill 1220. The conductive liner 1210 may be made of, for example, titanium, tantalum, nickel, platinum, palladium, erbium, ytterbium, or some combination thereof and formed using known metal deposition techniques including, but not limited to, CVD, PVD and ALD. The conductive fill 1220 may include, for example, tungsten, copper, aluminum, silver, gold, alloys thereof, and any suitable combination thereof, and may be deposited by any suitable technique, including but not limited to, for example, ALD, molecular layer deposition (MLD), CVD, in-situ radical assisted deposition, metal-organic chemical vapor deposition (MOCVD), MBE, PVD, sputtering, plating, evaporation, ion beam deposition, electron beam deposition, laser assisted deposition, chemical solution deposition, or any combination thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A method of forming a semiconductor structure, the method comprising:
   forming a sacrificial gate above a substrate, wherein a top surface of the sacrificial gate is covered by a hard mask;
   depositing a first interlevel dielectric (ILD) layer above the sacrificial gate;
   recessing the first ILD layer to a thickness less than the height of the sacrificial gate;
   depositing an etch barrier layer over the first ILD layer;
   depositing a second ILD layer above the etch barrier layer;
   planarizing the second ILD layer and the etch barrier layer to expose the hard mask using the hard mask as a planarization stop;
   removing the hard mask and the sacrificial gate to form a gate cavity;
   forming a replacement metal gate in the gate cavity;
   removing the second ILD layer;
   planarizing the replacement metal gate using the etch barrier layer as a planarization stop;
   replacing a top portion of the replacement metal gate with a gate cap;
   depositing a third ILD layer above the gate cap and the etch barrier layer;
   etching the third ILD layer, the etch barrier layer, and the first ILD layer to form a contact cavity self-aligned to the gate cap exposing at least a portion of a source/drain region adjacent to the replacement metal gate; and
   forming a metal contact in the contact cavity.

2. The method of claim 1, wherein the etch barrier layer comprises a material selected from the group consisting of hafnium oxide, hafnium silicate, and aluminum oxide.

3. The method of claim 1, wherein the combined thickness of the first ILD layer and the etch barrier layer is equal to approximately 20% to approximately 70% of the height of the sacrificial gate.

4. The method of claim 1, further comprising forming a supplementary electrode layer above the replacement metal gate prior to planarizing the replacement metal gate.

5. The method of claim 4, wherein the supplementary electrode layer comprises the same material as a gate electrode of the replacement metal gate.

6. The method of claim 1, further comprising:
   etching the third ILD layer, and the gate cap to form a contact cavity self-aligned to the etch barrier exposing at least a portion of the replacement metal gate; and
   forming a metal contact in the contact cavity.

7. A method of replacing a sacrificial gate with a replacement metal gate, the method comprising:
   forming an interlevel dielectric (ILD) stack above the sacrificial gate having a thickness approximately equal to the height of the sacrificial gate, wherein the ILD stack comprises a first ILD layer having a thickness less than the height of the sacrificial gate, an etch barrier layer above the first ILD layer, and a second ILD layer above the etch barrier layer;
   removing the sacrificial gate to form a gate cavity;
   forming a gate electrode in the gate cavity;
   removing the second ILD layer;
   planarizing the gate electrode using the etch barrier layer as a planarization stop;

replacing a top portion of the gate electrode with a gate cap;
depositing a third ILD layer above the gate cap and the etch barrier layer;
etching the third ILD layer, the etch barrier layer, and the first ILD layer to form a contact cavity self-aligned to the gate cap exposing at least a portion of a source/drain region adjacent to the gate electrode; and
forming a metal contact in the contact cavity.

8. The method of claim 7, wherein the etch barrier layer comprises a material selected from the group consisting of hafnium oxide, hafnium silicate, or aluminum oxide.

9. The method of claim 7, wherein the combined thickness of the first ILD layer and the etch barrier layer is equal to approximately 20% to approximately 70% of the height of the sacrificial gate.

10. The method of claim 7, further comprising forming a supplementary electrode layer above the replacement metal gate prior to planarizing the replacement metal gate.

11. The method of claim 10, wherein the supplementary electrode layer comprises the same material as a gate electrode of the replacement metal gate.

12. The method of claim 1, wherein the etching the third ILD layer, the etch barrier layer, and the first ILD layer to form a contact cavity comprises performing an anisotropic dry etch.

13. The method of claim 7, wherein the etching the third ILD layer, the etch barrier layer, and the first ILD layer to form a contact cavity comprises performing an anisotropic dry etch.

14. A method of replacing a sacrificial gate with a replacement metal gate, the method comprising:
forming an interlevel dielectric (ILD) stack above the sacrificial gate having a thickness approximately equal to the height of the sacrificial gate, wherein the ILD stack comprises a first ILD layer having a thickness less than the height of the sacrificial gate, an etch barrier layer above the first ILD layer, and a second ILD layer above the etch barrier layer;
removing the sacrificial gate to form a gate cavity;
forming a gate electrode in the gate cavity;
removing the second ILD layer;
planarizing the gate electrode using the etch barrier layer as a planarization stop;
replacing a top portion of the gate electrode with a gate cap;
depositing a third ILD layer above the gate cap and the etch barrier layer;
etching the third ILD layer and the gate cap to form a contact cavity self-aligned to the etch barrier layer exposing at least a portion of the gate electrode; and
forming a metal contact in the contact cavity.

15. The method of claim 14, wherein the etch barrier layer comprises a material selected from the group consisting of hafnium oxide, hafnium silicate, or aluminum oxide.

16. The method of claim 14, wherein the combined thickness of the first ILD layer and the etch barrier layer is equal to approximately 20% to approximately 70% of the height of the sacrificial gate.

17. The method of claim 14, further comprising forming a supplementary electrode layer above the replacement metal gate prior to planarizing the replacement metal gate.

18. The method of claim 17, wherein the supplementary electrode layer comprises the same material as a gate electrode of the replacement metal gate.

19. The method of claim 14, wherein the etching the third ILD layer, the etch barrier layer, and the first ILD layer to form a contact cavity comprises performing an anisotropic dry etch.

* * * * *